United States Patent [19]

Ballato

[11] Patent Number: 4,568,850

[45] Date of Patent: Feb. 4, 1986

[54] DOUBLY ROTATED CYLINDRICAL CRYSTAL RESONATOR

[75] Inventor: Arthur Ballato, Long Branch, N.J.

[73] Assignee: The United States of America as represented by the Secretary of the Army, Washington, D.C.

[21] Appl. No.: 700,573

[22] Filed: Feb. 11, 1985

[51] Int. Cl.$^4$ .............................................. H01L 41/08
[52] U.S. Cl. .................................... 310/361; 310/368; 310/369
[58] Field of Search ................. 310/360, 361, 367–369

[56] References Cited

U.S. PATENT DOCUMENTS

| | | | |
|---|---|---|---|
| 4,167,686 | 9/1979 | Fukuyo | 310/361 |
| 4,375,604 | 3/1983 | Vig | 310/361 X |
| 4,476,411 | 10/1984 | Okazaki et al. | 310/361 |
| 4,486,682 | 12/1984 | Nakazawa et al. | 310/361 |
| 4,499,395 | 2/1985 | Kahan | 310/361 |
| 4,542,355 | 9/1985 | Ballato | 310/361 |

OTHER PUBLICATIONS

Chapter 5, "Doubly Rotated Thickness Mode Plate Vibrators", Arthur Ballato, *Physical Acoustics*, vol. 13, Academic Press, New York, 1977 (W. P. Mason & R. N. Thurston, eds.) pp. 115–181, p. 143 discloses that the doubly rotated cut of quartz has particular motion out of the plane of the plate . . . .

*Primary Examiner*—Mark O. Budd
*Attorney, Agent, or Firm*—Anthony T. Lane; Jeremiah G. Murray; John T. Rehberg

[57] ABSTRACT

Improvement of resonator circuit parameters, unwanted mode suppression, and the frequency-temperature characteristic of a crystal resonator is provided by a doubly cut crystal resonator plane having at least one major face including a cylindrical contour, the axis of which is parallel to the direction of the projection of the eigenvector (the normal coordinate) for the desired operating mode. The cylinder axis is at an angle to the doubly rotated electrical axis such that the fast shear "b" mode is suppressed while the slow shear "c" mode is unaffected. The radius of the cylinder is selectively chosen for altering the frequency-temperature characteristic.

22 Claims, 10 Drawing Figures

DOUBLY ROTATED CYLINDRICAL CRYSTAL RESONATOR

The invention described herein may be manufactured or used by or for the Government for governmental purposes without the payment of any royalties thereon or therefor.

Cross Reference To Related Application

This invention is related to copending application Ser. No. 669,147, entitled, "Normal Coordinate Monolithic Crystal Filter", filed in the name of the present inventor on Nov. 7, 1984. This application, moreover, is specifically incorporated herein by reference.

Background of the Invention

1. Field of the Invention

This invention relates generally to the field of piezoelectric crystal resonators and more particularly to a method and means for controlling the operational characteristics of such devices, e.g. as the suppression of certain undesired vibrational modes and control of the frequency-temperature response 2. Description of the Prior Art Various cuts of quartz utilized as monolithic crystal resonators are well known. The AT cut of quartz has been extensively used, although any singly rotated cut of quartz or other material can be used. Recently, however, the use of doubly rotated cuts has been investigated and reported, for example, by the present inventor in Volume 13, Chapter 5, "Doubly Rotated Thickness Mode Plate Vibrators", of a textbook entitled, *Physical Acoustics*, (W. P. Mason and R. N. Thurston, EDS), Academic Press, New York, 1977, pp. 115–181.

One doubly rotated cut of quartz, namely the SC cut, has been found to be particularly useful; however, an inherent problem exists with doubly rotated SC cuts of quartz in that the direction of the projection in the plane of the plate of the particle motion for a given vibrational mode, referred to as the normal coordinate or the eigenvector projection, is askew at an angle relative to the doubly rotated axes in the plane of the plate. The resultant motion for a given mode is neither strictly along the plate thickness, nor perpendicular to it.

The mode comprising motion predominantly along the thickness direction is referred to as the thickness extensional mode, or mode "a". In addition to the "a" mode, two thickness shear modes exist. These have particle motion predominantly in the plane of the crystal plate. The particle motions of the three thickness modes are perpendicular to each other. The faster shear mode is called the "b" mode, while the slower is referred to as the "c" mode. Both shear modes have velocities that are less than that of the "a" mode. The letters "a", "b", and "c" are used to order the modes according to wave velocity, which is equivalent to ordering the modes according to frequency. The "a" mode is nearly always found to be undesirable, because of its negative frequency-temperature coefficient. The "b" mode is likewise found to be undesirable, while the "c" mode is normally the desired mode.

In addition to the three aforementioned thickness modes, there is a plethora of modes that arise from couplings between the three thickness modes (a, b, c) and the lateral boundaries of a finite plate; these are also considered to be unwanted modes, and are called anharmonic modes.

Assuring the absence, or at least the diminution, of unwanted modes is called mode control. Heretofore, mode control has been obtained in a number of different ways, such as: (a) beveling the plate edges from a rectangular cross section to a chamfered cross section; (b) contouring one or both sides of the resonator plate to produce plano-convex or bi-convex lens shapes; and (c) utilizing energy trapping by means of varying the electrode thicknesses or dielectric coatings applied to the surfaces of the resonator. The beveling and contouring are almost exclusively done on circular plates using spherical cups to produce the outline.

Accordingly, it is an object of the present invention to provide an improvement in piezoelectric crystal resonators.

It is a further object of the invention to provide an improved piezoelectric monolithic crystal which obviates the interference of lateral resonator boundaries with mechanical plate motion of a desired mode of vibration.

It is another object of the present invention to provide a monolithic crystal resonator which suppresses or at least minimizes the coupling to an undesired shear mode.

It is yet a further object of the invention to provide a resonator having a relatively larger motional capacitance and relatively smaller motional resistance for a given size crystal to provide thereby a resonator having a relatively high Q.

And it is still another object of the invention to provide for doubly rotated SC cut resonators having improved control and adjustment of the frequency vs. temperature operational characteristic.

SUMMARY

Briefly, the foregoing and other objects of the invention are provided by the method and apparatus for suppressing or at least minimizing an undesired mode of vibration and more particularly the relatively fast shear mode (b-mode) of a doubly rotated cut of piezoelectric material, e.g. the SC cut of quartz, by the inclusion of at least one cylindrical contour along the length of a plate-like resonator body and wherein the cylindrical axis is colinear with and at the same angle as the projection of the eigenvector for particle motion in the plane of the plate for the desired mode, i.e. the relatively slow shear mode (c-mode). Motional capacitance as well as motional resistance is optimized by the electrodes being formed on the resonator body for the complete length of the resonator and being at least one third the width of the body. The radius of the cylinder is further varied for control of the frequency-temperature response.

BRIEF DESCRIPTION OF THE DRAWINGS

While the present invention is defined in the claims annexed to and forming a part of the specification, a better understanding can be had by reference to the following description when taken in conjunction with the accompanying drawings in which:

DESCRIPTION OF THE PREFFERED EMBODIMENTS

Figure 1:
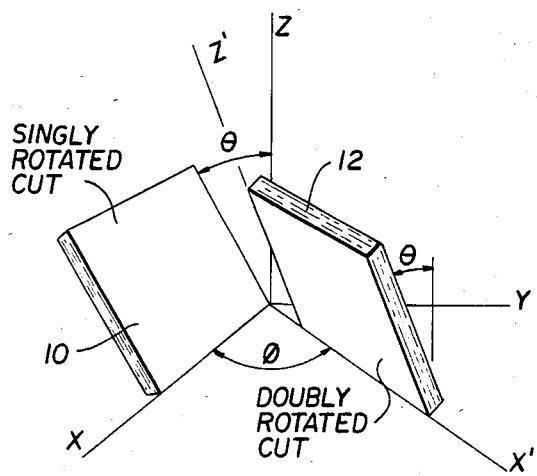
FIG. 1 is a diagram illustrative of singly rotated and doubly rotated cut quartz crystal resonator plates oriented in relation to their crystallographic axes.

Referring now to the drawings and more particularly to FIG. 1, shown thereat is a set of mutually perpendicular X, Y and Z axes which, as is well known, defines the crystallographic graphic axes of piezoelectric crystals according to the right-handed rectangular cartesian coordinate system. For quartz, the X axis represents the electrical axis, the Y axis represents the mechanical axis, and the Z axis represents the optical axis.

In FIG. 1, two relatively thin blanks or plates 10 and 12 are shown for the purpose of illustrating the distinction between well known singly and doubly rotated cuts of quartz. A singly rotated cut plate 10 has its major faces oriented at a polar angle $\theta$ with respect to the Z (optical) axis while the doubly rotated cut plate 12 includes not only the rotation angle $\theta$, but also a rotation from the X (electrical) axis to an axis X' by a second angle $\phi$. Accordingly, a doubly rotated cut comprises a plate having crystallographic orientations which are a function of both $\theta$ and $\phi$. Furthermore, one doubly rotated cut of quartz, known in the art as the SC cut, has been found to be particularly desirable when used as a piezoelectric plate resonator because of its ability to compensate for the effects of electrode stresses and/or temperature transients.

When a plate of isotropic material executes extensional motion by becoming alternately thicker or thinner, the direction of particle motion in the plane of the plate, known as the direction of the eigenvector projection or normal coordinate, is along the thickness direction. If, on the other hand, the plate slides back and forth in the thickness shear mode, the eigenvector or normal coordinate is perpendicular to the thickness and is in the direction of the motion of the shear.

In an anisotropic crystal plate, especially one cut at an arbitrary angle to its crystallographic axes, these vibrational motions are intercoupled so that even when it tries to execute an extensional motion and become thicker and thinner, it simultaneously exhibits a shear component of motion. The resultant motion is a combination of the two components and accordingly the eigenvector or normal coordinate is skewed.

In a singly rotated cut of piezoelectric material such as the popular AT cut of quartz, the crystal symmetry of the quartz plate accidentally makes the slower thickness shear mode (mode c), a pure mode, causing the eigenvector to be perfectly perpendicular to the plate thickness, to be in the plane of the plate, and along the X crystallographic axis. Furthermore, in monolithic crystal filters fabricated on AT plates, the electrodes are either parallel or perpendicular to this axis. In the doubly rotated cuts such as the SC cut, however, the lack of symmetry makes the particle motion and, accordingly, the projection of the eigenvector, lie out of the plane of the plate. Its projection in the plane of the plate lies at a specific angle $\psi$ from the rotated X' axis as shown, for example, in FIG. 2.

As taught in related application Ser. No. 669,147, entitled, "Normal Coordinate Monolithic Crystal Filter", the reduction of undesired mode couplings, improper phase and insertion loss responses as well as compensating for stress and transient temperature effects on the SC cut of quartz is achieved by aligning the electrodes fabricated on the surfaces of the flat crystal plate, as well as the sides of the crystal itself, along the direction of the projection of the eigenvector or normal coordinate. Also, in the case of a trapped-energy, two-port, monolithic filter type device, the electrode gap is arranged so that gap is perpendicular to the eigenvector projection. Furthermore, for the SC cut of quartz operating in the slow shear mode (c-mode) the projection angle of the eigenvector as well as the direction of the electrodes and sides of the crystal plate is at an angle of approximately 8.2° from the X' axis of the doubly rotated cut.

Figure 2:
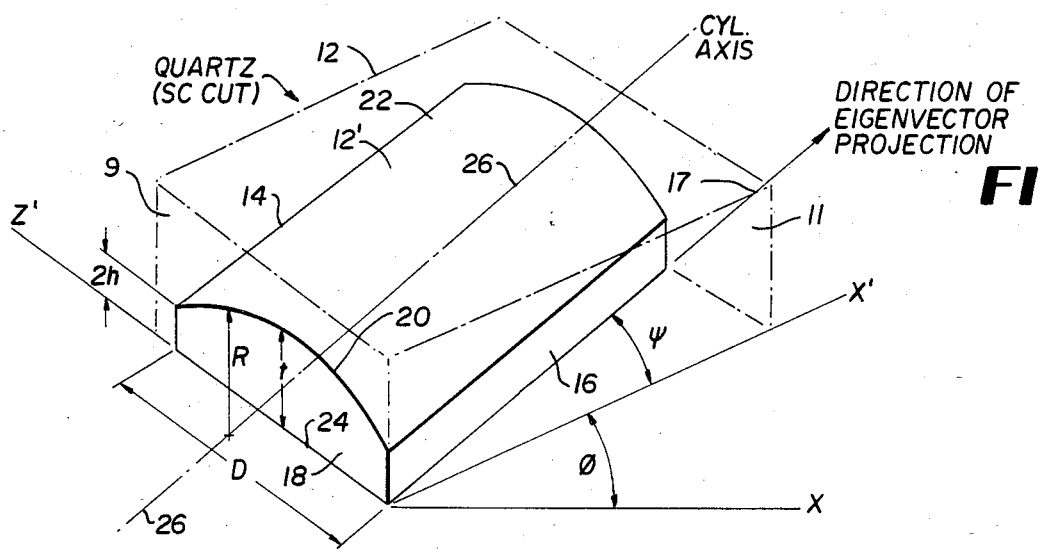
FIG. 2 is a perspective view of a monolithic crystal resonator configured in accordance with the subject invention.

Considering now the present invention, reference is first made to FIG. 2 wherein reference numeral 12 denotes a generally rectangular plate-like body of doubly rotated SC cut of quartz and which is shown in a phantom view with the front and one adjacent side 9 and 11 being mutually coincident with the Z' and X' axes. From this doubly rotated cut plate 12, there is formed a resonator body 12'. The resonator 12' includes a pair of elongated side walls 14 and 16 with a height dimension of 2h. The side walls 14 and 16, moreover, are parallel to the direction of the eigenvector projection 17 for the c-mode which, as is well known, for the SC cut of quartz is at an angle $\psi$ of 8.2° from the X' axis. Such a configuration operates to enhance proper phase and insertion loss response and reduce undesired mode couplings, and give greater latitude in the design of energy trapped monolithic crystal filters, as well as in compensating for the effects of electrode stresses and/or temperature transients. However, the present invention further contemplates suppression of the undesired fast shear (b-mode)and its anharmonic modes by the inclusion of a cylindrical contour 20 on at least one of its two opposing major surfaces or faces 22 and 24. As shown in FIG. 2, the contour 20 is included in the upper face 22. The cylindrical contour 20 additionally has a cylindrical axis 26 which is directed along and is parallel to the direction of the eigenvector projection 17 for the c-mode of vibration. Further as shown in FIG. 2, the resonator body 12' comprises a generally rectangular or square configuration which may be considered as a section of a cylinder having a cylindrical contour of radius R whose center lies below the bottom planar face 24. The overall thickness of the resonator body 12' comprises the dimension t while the separation between the side walls 14 and 16 defines the width dimension D. The side faces 14 and 16 having a height of 2h provide surfaces to accommodate a crystal mount such as a pedestal, not shown.

The partial cylinder crystal plate resonator 12' having its cylindrical axis 26 parallel to the direction of the eigenvector projection 17 can be fabricated by any desired means such as by mechanical machining, chemical etching or a combination of both of these means, as well as by the techniques disclosed, for example, in applicant's previously granted patents, U.S. Pat. Nos. 4,388,146 and 4,389,275.

Figure 3:
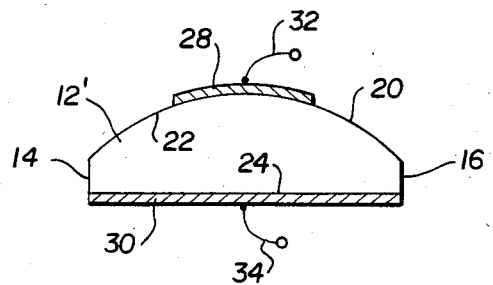
FIG. 3 is a transverse cross section of a crystal resonator such as shown in FIG. 2 and having electrodes applied to the top and bottom faces thereof.
Figure 4:
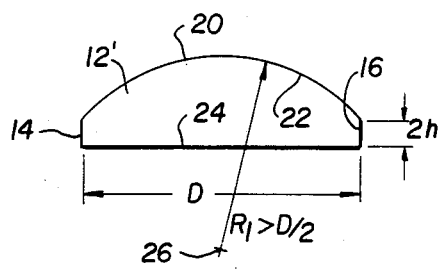
FIGS. 4 and 5 are illustrative of similar type transverse cross sections of two embodiments of the subject invention.

Once the resonator 12' has been fabricated to include the cylindrical contour 20, electrodes 28 and 30 are applied to the contoured upper major face 22 and the planar lower major face 24 as shown in FIG. 3. An electrical energizing potential is applied to the electrodes 28 and 30 by means of a pair of leads 32 and 34. Motional capacitance and resistance can be optimized by configuring the upper electrode 28 in a plurality of rectangular electrode patches that they linearly extend the complete length of resonator 12' and which are aligned with the cylindrical axis 26. The patches extend transversely across the contoured surface 22 by one third to one half the width dimension D. The bottom surface 24 is completely covered by electrode material as shown but may be configured, when desirable, in the same fashion as the top electrode patches. Moreover, the patches may be configured as a multiresonator monolithic crystal filter, rather than a single resonator.

The thickened central region of the resonator 12' shown in FIGS. 2 and 3, moreover, provides a device whose motional capacitance can furthermore be made larger while the motional resistance can be smaller, thus providing for a resonator which exhibits a relatively higher Q for a given size crystal. Also, the cylindrical type resonator 12' can take many different forms, several variations of which are shown in FIGS. 4 through 8.

Figure 5:
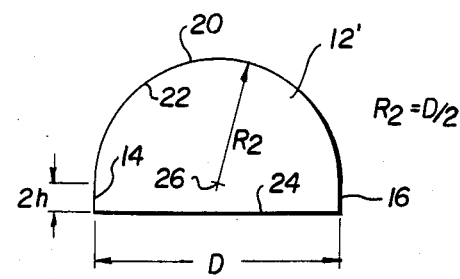

Referring now to FIGS. 4-8, FIG. 4 illustrates a transverse section which is substantially that of the embodiment shown in FIG. 2 wherein the radius $R_1$ for the cylindrical surface 22 is greater than D/2 with the cylindrical axis 26 being located beneath the flat lower major face 24. The configuration of FIG. 5 is similar to that of FIG. 4 and discloses a cylindrical surface 20 having a radius $R_2$ which is equal to D/2 and wherein the cylindrical axis 26 lies above the planar lower face 24. In both the configurations of FIGS. 4 and 5, the flat side surfaces 14 and 16 have a height of 2h.

Figure 6:
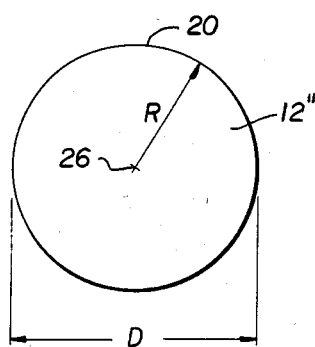
FIGS. 6 and 7 are illustrative of similar type transverse cross sections of two other embodiments of the subject invention.
Figure 7:
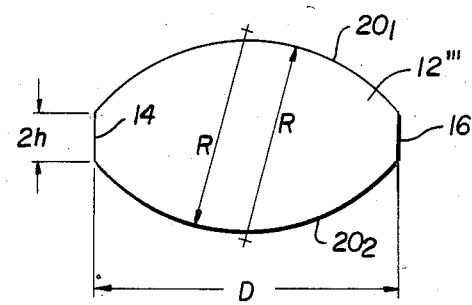
Figure 8:
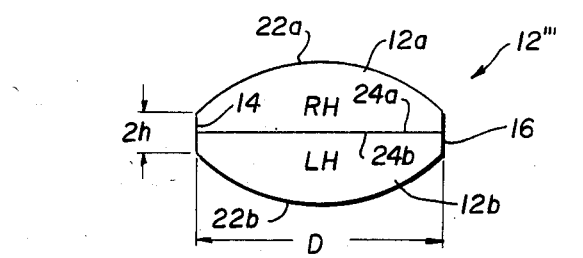
FIG. 8 is a transverse cross section illustrative of a pair of right-handed and left-handed enantiomorphs joined together to form still another embodiment of the invention.

Turning attention now to the embodiments shown in FIGS. 6, 7 and 8, the embodiment of FIG. 6 comprises a resonator 12" in the form of a total cylinder of a diameter D and thus having but a single cylindrical contour 20. The configuration of FIG. 7 comprises a single crystal resonator 12'" having not one, but a pair of upper and lower cylindrical convex contours $20_1$ and $20_2$ of equal radius R while having elongated side surfaces 14 and 16 of a height 2h. In both instances, the embodiments of 6 and 7 both have an outside width of D.

Figure 9:
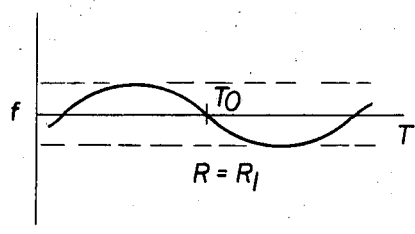
FIGS. 9 and 10 are two frequency-temperature characteristic curves illustrative of the variation thereof as a funtions of the radius of the cylindrical contour of the embodiments of the invention.
Figure 10:
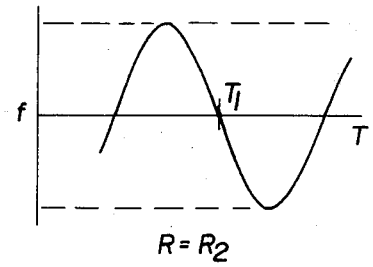

With respect to the embodiment of FIG. 8, what is shown there is an embodiment similar to that of FIG. 7 with the exception that the resonator 12'" includes two separate crystal body members $12_a$ and $12_b$ respectively comprising right-handed and left-handed enantiomorphs which are joined together along their respective flat inner major faces $24_a$ and $24_b$ to provide a composite device that is very insensitive to the effects of acceleration and vibration. Both outer major faces $22_a$ and $22_b$ include a cylindrical convex contour which extends in opposite directions. The frequency-temperature characteristic of the embodiments shown in FIGS. 4 through 8, for example, can furthermore be controlled by changing the cylindrical radius R of the resonator with respect to the maximum possible thickness. This is shown by the characteristic curves in FIGS. 9 and 10 where, for example, a resonator having a contour whose radius R is equal to $R_1$, the frequency variation about a center temperature $T_O$ is relatively small when compared with the curve of FIG. 10 wherein a radius of $R_2$ provides a relatively larger frequency swing for a center temperature $T_1$. While FIG. 2 discloses a monolithic crystal resonator fashioned from an SC cut of quartz wherein the direction of the eigenvector projection 17 is at an offset angle $\psi$ of substantially 8.2° from the doubly rotated electrical axis X', other doubly rotated cuts located on the zero temperature coefficient of frequency locus are also suitable for operation. The most prominent doubly rotated cuts of quartz in this category are listed in the following Table I along with the angle $\theta$ and the angle $\psi$ between the X' axis and the eigenvector projection 17.

TABLE I

| CUT | $\theta$ (degrees) | $\psi$ (degrees) |
| --- | --- | --- |
| AT | 0 | 0 |
| 5 V | 5 | 1.9 |
| 10 V | 10 | 3.7 |
| 13.9 V | 13.9 | 5.2 |
| FC | 15 | 5.6 |
| IT | 19.1 | 7.2 |
| SC | 21.9 | 8.2 |
| 25 V | 25 | 9.4 |
| 30 V | 30 | 11.4 |

Thus what has been shown and described is an improvement in piezoelectric monolithic crystal resonators comprised of doubly rotated cuts of piezoelectric material having a cylindrical contour on at least one of its major faces and having its cylindrical axis aligned with the direction of the projection of the eigenvector for the desired mode of vibration. The cylindrical shape energy traps the desired motion of the c-mode which is along the cylindrical axis. The undesired b-mode, however, is strongly discriminated against because its motion is perpendicular to the cylindrical axis. Such devices are particularly useful in connection with crystal oscillators and filters for signal processing and frequency control in communications systems.

Having thus shown and described what is at present considered to be the preferred embodiments of the invention, it should be pointed out that the same has been made by way of illustration and not limitation. Accordingly, all alterations, modifications and changes coming within the spirit and scope of the invention as defined in the appended claims are herein meant to be included.

I claim:

1. A piezoelectric monolithic crystal resonator providing undesired vibrational mode suppression, comprising:
   a resonator body of a doubly rotated cut of piezoelectric material, said body having at least one major face including a cylindrical contour wherein the cylindrical axis of said contour is substantially aligned with the direction of the projection of the eigenvector for the desired operating mode whereby a vibrational mode perpendicular to said cylindrical axis is suppressed; and
   electrode means on said resonator body for applying an excitation potential thereto.

2. The crystal resonator as defined by claim 1 wherein said doubly rotated cut of piezoelectric material comprises a doubly rotated cut of quartz.

3. The crystal resonator as defined by claim 1 wherein the direction of the projection of the eigenvector is at an angle $\psi$ which is greater than zero and equal to or less than 11.4° from a reference axis $X'$ which is rotated a predetermined angle $\phi$ from the electrical axis X of the crystal, and wherein the angle of rotation $\phi$ is greater than zero and equal to or less than 30°.

4. The crystal resonator as defined by claim 1 wherein the desired operating mode comprises the slow shear mode c-mode and wherein the undesired mode comprises the fast shear mode (b-mode).

5. The crystal resonator as defined by claim 1 wherein said resonator body comprises a generally rectangular plate-like body additionally including a second major face opposing said one major face and a pair of adjoining side surfaces, said side surfaces being comprised of elongated surfaces of predetermined height substantially aligned with the direction of the projection of the eigenvector for the desired operating mode.

6. The crystal resonator as defined by claim 5 wherein said second major face comprises a substantially flat face.

7. The crystal resonator as defined by claim 5 wherein the distance separating said side surfaces defines the width dimension of said resonator body and wherein said cylindrical contour includes a radius which is equal to or greater than one half the width dimension.

8. The crystal resonator as defined by claim 5 wherein said second major face also includes a cylindrical contour and wherein the cylindrical axis of both contours is substantially aligned with the direction of the projection of the eigenvector for the desired operating mode.

9. The crystal resonator as defined by claim 8 wherein separation between said side surfaces defines the width dimension of said resonator body and wherein the radii of both cylindrical contours are equal to or greater than one half said width dimension.

10. The crystal resonator as defined by claim 9 wherein the radii of both cylindrical contours are substantially equal.

11. The crystal resonator as defined by claim 9 wherein said resonator body is comprised of first and second mutually contiguous body members respectively comprised of right-handed and left-handed enantiomorphs.

12. The crystal resonator as defined by claim 5 wherein said electrode means are located on the two major faces and extending substantially the entire length of said resonator body and being substantially aligned with the direction of the projection of the eigenvector for the desired operating mode.

13. The crystal resonator as defined by claim 12 and wherein said electrode means have a transverse dimension relative to the cylindrical axis which is at least one third to one half the width of the resonator body.

14. A method for suppressing undesired operating modes in a piezoelectric monolithic crystal resonator comprising the steps of:
forming a doubly rotated cut of piezoelectric material into a resonator body having at least one major face including a cylindrical contour wherein the cylindrical axis of said contour is substantially aligned with the direction of the projection of the eigenvector for the desired operating mode whereby an operating mode perpendicular to the cylindrical axis is suppressed.

15. The method as defined by claim 14 wherein said step of forming said resonator body comprises forming a generally rectangular plate-like body and additionally forming another major face opposing said one major face as well as forming a pair of adjoining side surfaces with said side surfaces being substantially aligned with the direction of the projection of the eigenvector for the desired operating mode.

16. The method as defined by claim 15 wherein the distance between said side surfaces defines the width dimension of said plate-like body and wherein the cylindrical contour includes a radius equal to or greater than one half the width dimension.

17. The method as defined by claim 15 wherein said step of forming said resonator body additionally includes the step of forming a cylindrical contour of said another major face of said resonator body.

18. The method as defined by claim 15 wherein said step of forming said resonator body additionally includes forming a generally flat surface on said another major face of said resonator body.

19. The method as defined by claim 15 wherein said step of forming said cylindrical contours on both major faces comprises forming cylindrical contours having substantially the same radius and centers aligned with said cylindrical axis.

20. The method of claim 14 and additionally including the step of forming electrode means on said resonator body for the application of an excitation potential.

21. The method as defined by claim 20 and wherein said step of forming electrode means comprises forming electrodes on both said major faces, said electrodes extending substantially the entire length of said body and being substantially aligned with the projection of the eigenvector for the desired operating mode.

22. The method of claim 14 wherein said step of forming said resonator body comprises forming first and second resonator body halves respectively comprised of right-handed and left-handed enantiomorphs, each said body half having a major face including a cylindrical contour, and placing said body halves in contiguous contact with one another so that said major faces comprise external surfaces of said resonator body.

* * * * *